United States Patent
Segawa

(10) Patent No.: US 6,942,745 B2
(45) Date of Patent: Sep. 13, 2005

(54) PRODUCTION METHOD OF CIRCUIT BOARD MODULE

(75) Inventor: Shigetoshi Segawa, Niihama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 240 days.

(21) Appl. No.: 10/220,211

(22) PCT Filed: Dec. 27, 2001

(86) PCT No.: PCT/JP01/11518

§ 371 (c)(1),
(2), (4) Date: Aug. 27, 2002

(87) PCT Pub. No.: WO02/054843

PCT Pub. Date: Jul. 11, 2002

(65) Prior Publication Data

US 2003/0034127 A1 Feb. 20, 2003

(30) Foreign Application Priority Data

Dec. 28, 2000 (JP) ........................... 2000-402873

(51) Int. Cl.⁷ .............................................. H05K 3/46
(52) U.S. Cl. ....................................... 156/60; 29/830
(58) Field of Search ....................... 156/60; 438/118, 438/119; 29/830

(56) References Cited

U.S. PATENT DOCUMENTS 5,592,365 A   1/1997 Sugimoto et al.
6,255,138 B1 * 7/2001 Haishima .................... 438/119

FOREIGN PATENT DOCUMENTS

| GB | 2 345 201 | 6/2000 |
| JP | 1-251787 | 10/1989 |
| JP | 4-211195 | 8/1992 |
| JP | 5-191008 | 7/1993 |
| JP | 8-46314 | 2/1996 |
| JP | 10-284818 | 10/1998 |

\* cited by examiner

*Primary Examiner*—John T. Haran
(74) *Attorney, Agent, or Firm*—Hamre, Schumann, Mueller & Larson P.C.

(57) ABSTRACT

The present invention provides a method of manufacturing a circuit board module for connecting a circuit conductor (2) of a first circuit board (1) to a circuit conductor (4) of a second circuit board (5) using at least one selected from the group consisting of an anisotropic conductive film (6), an anisotropic conductive paste and an adhesive resin, wherein a difference in a pattern width between the circuit conductor of the first circuit board and that of the second circuit board is in a range of 5 $\mu$m to 50 $\mu$m. In such a method of manufacturing a circuit board module, connection of a connecting conductor with a narrow pitch can be realized, and poor connection can be reduced, thus providing a method of manufacturing a circuit board module having higher reliability.

2 Claims, 1 Drawing Sheet

PRODUCTION METHOD OF CIRCUIT BOARD MODULE

TECHNICAL FIELD

The present invention relates to a method of manufacturing a high-density circuit board module employing a ceramic circuit board and a flexible printed circuit (FPC).

BACKGROUND ART

Recently, the packaging density of an electronic circuit has been greater, and a circuit board and a device have been reduced in size by the use of a ceramic multilayer circuit board and a flexible printed circuit (FPC). In a conventional technique for connecting an FPC to either a ceramic circuit board or a printed board, connectors are mounted previously on the boards so as to provide a connection between the connectors, or the FPC is inserted into the connectors. As for a circuit board in which a mounting area or height of the connectors cannot be ensured, solder is used for the connection.

Hereinafter, a conventional connection method using solder will be described with reference to FIG. 3. In FIG. 3, reference numerals 1, 2, 3, 4 and 5 denote a ceramic circuit board, a circuit conductor on the ceramic circuit board, solder for connection, a circuit conductor on an FPC, and an FPC, respectively.

Conventionally, the ceramic circuit board is connected to the FPC using solder as follows. Cream solder is printed previously on the connecting circuit conductor on the ceramic circuit board. Afterwards, the ceramic circuit board and the FPC are positioned at a predetermined place and subjected to thermo-compression bonding. Otherwise, the FPC is solder-plated before carrying out the above-described thermo-compression bonding.

Moreover, recently, adopting an anisotropic conductive film, an anisotropic conductive paste or an adhesive resin for the connection has been examined.

The anisotropic conductive film and the anisotropic conductive paste refer to a film and a paste providing an electrical connection that is conductive in a single direction and insulated in a direction perpendicular to the single direction. The electrical connection can be obtained by dispersing conductive particles in the resin film and the resin paste, and subjecting the resin to the thermo-compression bonding. Accordingly, when this anisotropic conductive film or the anisotropic conductive paste is used for configuring an adhesive layer, the circuit connector on the FPC and that on the ceramic circuit board are connected electrically to each other through the conductive particles in the anisotropic conductive film or the anisotropic conductive paste.

On the other hand, when the adhesive layer is configured using an adhesive resin having no conductive particles therein, the circuit conductor on the FPC and that on the ceramic circuit board are in direct contact with each other, and the circumference of the contact portion is adhered by the adhesive resin.

However, the above-described conventional method has the following problems.

First, connection between a ceramic circuit board and an FPC by using connectors is difficult, since the sizes and heights of large connector parts are quite unfavorable to the recent trend of miniaturization of modules, and pitches of circuit conductors to be connected become narrower. Moreover, the larger the number of connection pins, the more increased a price of the connector part. As described above, the conventional method is not suitable for manufacturing a high-density and miniaturized module in view of the cost performance and the performance capability.

Second, when solder is used for connecting the ceramic circuit board to the FPC, it is required that a connecting conductor on the ceramic circuit board or a connecting conductor on the FPC is soldered previously. At this time, a method of printing a cream solder on the connecting conductor on the ceramic circuit board is quite difficult to carry out, in the case where a pattern pitch becomes narrower than 500 $\mu$m. In a method of solder-plating the connecting conductor on the FPC, it is quite difficult to secure the soldering amount and accuracy at adequate degrees for the connection when the pattern pitch becomes narrower than 500 $\mu$m, which results in increased cost of FPC.

Even when soldering is conducted according to the method, a short can occur with adjacent patterns depending on connection conditions such as a temperature and a pressure. Thus, a stable connection condition is hard to find, and also the connection reliability varies in volume production.

Third, when any of the anisotropic conductive film, the anisotropic conductive paste or the adhesive resin is used for the connection between the ceramic circuit board and the FPC, at least about 150° C. of heat and about 30 kg/cm$^2$ of a pressure are required. Accordingly, in the case of a connecting conductor with a narrow pitch, the pattern pitch of the FPC varies due to the heat and the pressure when the thermo-compression bonding is conducted in the case of a significant difference in thermal coefficients of expansion between the ceramic circuit board and the FPC. This results in defects such as a short with the adjacent connecting pattern on the ceramic circuit board occurring, which results in a difficulty of position adjustment between the ceramic circuit board and the FPC.

DISCLOSURE OF THE INVENTION

The present invention is made to solve the above-described problems of the conventional method, and aims to provide a method of manufacturing a circuit board module that realizes connection of connecting conductors with a narrow pitch, and reduces poor connection, and hence obtains a higher reliability.

Therefore, with the foregoing in mind, it is an object of the present invention to provide a method of manufacturing a circuit board module wherein a circuit conductor of a first circuit board and that of a second circuit board are connected using at least one selected from the group consisting of an anisotropic conductive film, an anisotropic conductive paste and an adhesive resin.

Thus, the circuit boards can be connected using no components such as a connector or the like. Therefore, detrimental effects due to the size and the height of the connector part can be eliminated. The defects cause problems in connecting the ceramic circuit board to the FPC by using the connector. Further, soldering of either the connection conductor on the ceramic circuit board or that on the FPC, which is performed in a connection using solder, is not required. Therefore, the method can be applied to a case where the pattern pitch is narrower than 500 $\mu$m or the number of connection pins is increased.

Further, the present invention provides a method of manufacturing a circuit board module for connecting a circuit conductor of a first circuit board to that of a second circuit board using at least one selected from a group consisting of an anisotropic conductive film, an anisotropic conductive paste and an adhesive resin, wherein a difference in a pattern width between the circuit conductor of the first circuit board and that of the second circuit board is in a range of 5 μm to 50 μm.

Thus, even when the connecting conductor with a narrow pitch is used, variations caused by extensions in the FPC due to heat and pressure at the time of connecting can be accommodated. Further, defects such as a short with a connection pattern on a ceramic board adjacent to the FPC pattern can be restrained when the defects are caused by variations in a pattern pitch of the FPC. Thus, the position adjustment between the ceramic board and the FPC can be facilitated.

Further, according to the method of manufacturing a circuit board module of the present invention, a pattern pitch between the connection conductor of the first circuit board and that of the second circuit board is preferably in a range of 20 μm to 500 μm.

BEST MODE FOR CARRYING OUT THE INVENTION

Figure 1:
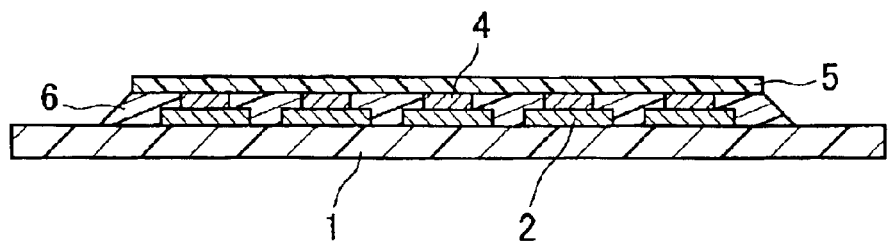
FIG. 1 is a cross-sectional view of a circuit board module manufactured by a method of manufacturing a circuit board module of the present invention.

FIG. 1 is a cross-sectional view of a circuit board module manufactured by a method of manufacturing a circuit board module of the present invention. In FIG. 1, reference numerals 1, 2, 4, 5 and 6 denote a ceramic circuit board, a circuit conductor on the ceramic circuit board, a circuit conductor on an FPC, an FPC and an anisotropic conductive film, respectively.

Figure 2:
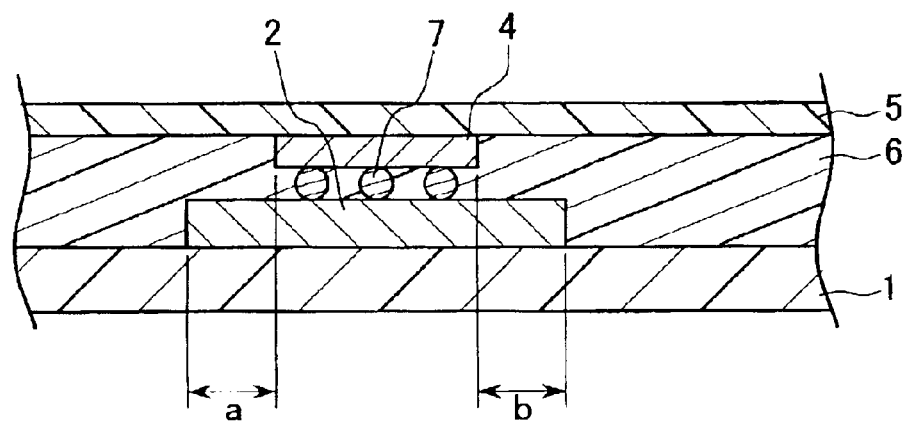
FIG. 2 is a cross-sectional view illustrating a primary part of FIG. 1.
Figure 3:
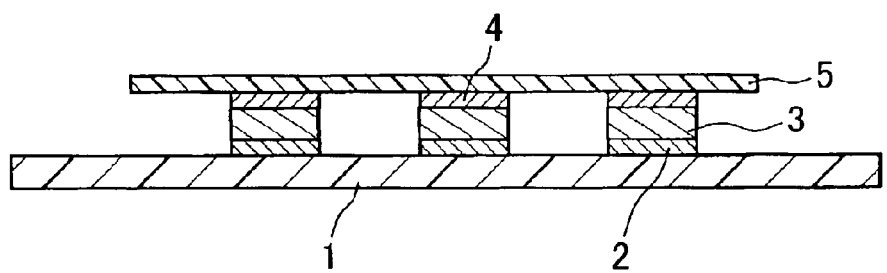
FIG. 3 is a cross-sectional view of a circuit board module manufactured by a conventional method of manufacturing a circuit board module.

FIG. 2 is a cross-sectional view illustrating a primary part of FIG. 1. In FIG. 2, reference numerals 1, 2, 4, 5, 6 and 7 denote a ceramic circuit board, a circuit conductor on the ceramic circuit board, a circuit conductor on an FPC, an FPC, an anisotropic conductivity film and conductivity particles in the anisotropic conductivity film, respectively. In FIG. 2, a difference in a pattern width (a+b) between the circuit conductor on the ceramic circuit board 1 and that on the flexible printed circuit (FPC) 5 is set to be in a range of 5 μm to 50 μm.

A method of manufacturing a circuit board module of the present invention will be described as follows.

A predetermined jig or a recognition position adjustment apparatus is employed for adjusting positions of the circuit conductor on the FPC to be connected and that on the ceramic circuit board for the purpose of connection. At this time, a pattern pitch of the circuit conductor to be connected is in a range of 20 μm to 500 μm, and thus a difference in a pattern width (a+b) between the circuit conductor on the ceramic circuit board and that on the FPC is previously set in a range of 5 μm to 50 μm.

Then, an anisotropic conductive film is mounted as a connecting material between the FPC and the ceramic circuit board, or the anisotropic conductive paste or an adhesive resin is coated previously on the FPC and the ceramic circuit board. It should be noted that "CP7632KS" produced by Sony Chemicals Corporation can be employed as the anisotropic conductive film, and "J8958" produced by Oogi Chemical Industry Co., Ltd. can be employed as the anisotropic conductive paste, and an epoxy resin or the like can be employed as the adhesive resin.

At this time, the anisotropic conductive paste or the adhesive resin can be coated on either side of the ceramic circuit board or the FPC. Moreover, a printing method employing a screen mask or a metal mask, or a dispenser method can be adopted as a coating method. The anisotropic conductive paste or the adhesive resin coated as described above is dried at a temperature in a range of 50° C. to 200° C. so as to be formed on the ceramic circuit board or the FPC. Subsequently, the ceramic circuit board and the FPC, which positions are adjusted as described above, are subjected to thermo-compression bonding under 150° C. to 300° C. of heat and 10 kg/cm$^2$ to 100 kg/cm$^2$ of pressure for 5 seconds to 60 seconds. Thus, the ceramic circuit board and the FPC are connected to each other, thereby completing a circuit board module. Since the conditions of the thermo-compression bonding at this time vary according to a pattern, a circuit board area or thickness of the ceramic circuit board and the FPC, the above conditions of the thermo-compression bonding will not be limited specifically.

Table 1 shows relationships between the difference in a pattern width (a+b) and the pattern pitch of the circuit conductor.

TABLE 1

| a + b (μm) | pitch (μm) | | | | | | |
|---|---|---|---|---|---|---|---|
| | 10 | 20 | 50 | 100 | 200 | 500 | 700 |
| 0 | Defective | Defective | Defective | Defective | Fair | Fair | Good |
| 2 | Fair | Defective | Fair | Fair | Fair | Fair | Good |
| 5 | Defective | Good | Good | Good | Good | Good | Good |
| 10 | Defective | Fair | Good | Good | Good | Good | Good |
| 30 | Defective | Defective | Defective | Good | Good | Good | Good |
| 50 | Defective | Defective | Defective | Defective | Fair | Good | Good |
| 100 | Defective | Defective | Defective | Defective | Defective | Fair | Good |

Good: Connection can be carried out easily without shifts of position.
Fair: Shifts of position can occur to cause a defect.
Defective: A defect occurs.

As shown in Table 1, as the pattern pitch becomes larger than 500 μm, a space between the patterns becomes wider. Therefore, even when the difference in a pattern width (a+b) becomes 0, a defect due to shift in the adjusted position does not occur. In contrast, when the pattern pitch becomes smaller than 20 μm, it is difficult to control the difference in a pattern width (a+b) at a value smaller than 5 μm, and a defect occurs due to the shift in the adjusted position. When the difference in a pattern width (a+b) is set to be larger than 50 μm, a short between the patterns might occur in the case where the pattern pitch is smaller than 500 μm. Therefore, when the pattern pitch is in a range of 20 μm to 500 μm, it is preferable to control the difference in a pattern width (a+b) within a range of 5 μm to 50 μm.

Industrial Applicability

As described above, the method of manufacturing the circuit board module of the present invention employs an anisotropic conductive film, an anisotropic conductive paste or an adhesive paste in order to connect a ceramic circuit board to a flexible printed circuit (FPC). Therefore, connection with a narrow pitch of not more than 500 μm can be realized, which used to be impracticable according to the conventional method using solder or the like.

Moreover, the pattern pitch of the circuit conductor of the circuit board to be connected is in a range of 20 μm to 500 μm, and the difference in a pattern width between the ceramic circuit board and the FPC is in a range of 5 μm to 50 μm. Thus, even when a connecting conductor with a narrow pitch is used, it is possible to accommodate variations due to extensions in the FPC caused by heat and pressure at the time of connection. Further, it is possible to restrain a defect such as a short between the pattern of the FPC and the adjacent connecting pattern on the ceramic circuit board side due to variations in the pattern of FPC. Therefore, the position adjustment between the ceramic circuit board and the FPC can be facilitated remarkably.

What is claimed is:

1. A method of manufacturing a circuit board module for connecting a circuit conductor of a first circuit board to a circuit conductor of a second circuit board using at least one selected from the group consisting of an anisotropic conductive film, an anisotropic conductive paste and an adhesive resin, wherein the first circuit board is a flexible printed circuit, the second circuit board is a ceramic circuit board, and a pattern width of the circuit conductor of the flexible printed circuit is narrower than a pattern width of the circuit conductor of the ceramic circuit board, comprising:

setting a difference in the pattern width between the circuit conductor of the first circuit board and the circuit conductor of the second circuit board, represented as (a+b), to be in a range of 5 μm to 50 μm, setting the positions of the circuit conductor of the first circuit board and of the circuit conductor of the second circuit board to have respective pattern pitches in a range of 20 μm to 500 μm when (a+b) is 5 μm, setting the pattern pitches to be in a range of 50 μm to 500 μm when 5 μm<(a+b)≦10 μm, setting the pattern pitches to be in a range of 100 μm to 500 μm when 10 μm<(a+b)≦30 μm, and setting the pattern pitches to be 500 μm when 30 μm<(a+b)≦50 μm.

2. The method of manufacturing a circuit board module according to claim 1, wherein at least one selected from the group consisting of the anisotropic conductive film, the anisotropic conductive paste and the adhesive resin has conductive particles.

* * * * *